(12) United States Patent
Rivera (10) Patent No.: US 10,649,016 B1
(45) Date of Patent: May 12, 2020

(54) DIELECTRIC MEASUREMENT PROBE FOR CURVED SURFACES

(71) Applicant: The United States of America as represented by the Secretary of the Navy, Newport, RI (US)

(72) Inventor: David F Rivera, Westerly, RI (US)

(73) Assignee: The United States of America as represented by the Secretary of the Navy

( * ) Notice: Subject to any disclaimer, the term of this patent is extended or adjusted under 35 U.S.C. 154(b) by 63 days.

(21) Appl. No.: 16/195,897

(22) Filed: Nov. 20, 2018

Related U.S. Application Data (60) Provisional application No. 62/589,621, filed on Nov. 22, 2017.

(51) Int. Cl.
*G01R 27/26* (2006.01)

(52) U.S. Cl.
CPC ....... *G01R 27/2676* (2013.01); *G01R 27/267* (2013.01); *G01R 27/2623* (2013.01)

(58) Field of Classification Search
None
See application file for complete search history.

(56) References Cited

U.S. PATENT DOCUMENTS

| | | | | |
|---|---|---|---|---|
| 5,065,106 A * | 11/1991 | Hendrick | ................. | G01B 7/14 324/663 |
| 6,472,885 B1 * | 10/2002 | Green | ................... | G01N 22/00 324/638 |
| 7,075,314 B2 * | 7/2006 | Ehata | ..................... | G01N 22/00 324/639 |
| 7,495,454 B2 * | 2/2009 | Rivera | ................... | G01N 22/00 324/601 |
| 2014/0347073 A1 * | 11/2014 | Brown | ............... | G01N 21/3581 324/637 |
| 2014/0375337 A1 * | 12/2014 | Meaney | ............... | G01N 27/221 324/649 |

FOREIGN PATENT DOCUMENTS

JP          11108608 A  *  4/1999  ............... G01B 7/06

* cited by examiner

*Primary Examiner* — Jermele M Hollington
(74) *Attorney, Agent, or Firm* — James M. Kasischke; Michael P. Stanley (57) ABSTRACT

A probe is provided for measuring permittivity of a dielectric material. The probe includes side electrodes and a pivotable center electrode with a bulbous tip to contact the material. A mounting harness supports the side electrodes and a feed connector with the center electrode soldered to the connector. The tip includes a contoured surface for measurement and rotation on the material. The bulbous tip can rest perpendicularly or in a pivoted position on the material without a loss of measurement accuracy. A saddle ensures that a measurement of the reflection coefficient is near the bulbous tip. In use, a voltage wave generated by a vector network analyzer is guided between the electrodes toward the tip and into the material. The material reflects this voltage wave back to the analyzer. The ratio of the reflected and forward voltages forms a reflection coefficient as a baseline for measuring permittivity.

6 Claims, 9 Drawing Sheets

DIELECTRIC MEASUREMENT PROBE FOR CURVED SURFACES

The present application claims the benefit of U.S. Provisional Application Ser. No. 62/589,621 filed on 22 Nov. 2017 by the inventor, David F. Rivera and entitled "Dielectric Measurement Probe for Curved Surfaces".

STATEMENT OF GOVERNMENT INTEREST

The invention described herein may be manufactured and used by or for the Government of the United States of America for governmental purposes without the payment of any royalties thereon or therefor.

CROSS REFERENCE TO RELATED PATENT APPLICATIONS

None.

BACKGROUND OF THE INVENTION

1) Field of the Invention

The present invention is a device and supporting assembly for measuring electrical properties over a range of frequencies for a dielectric material in which surface contours of the material are concave or convex.

2) Description of the Prior Art

The nondestructive measurement of insulating materials includes using an open-ended coaxial probe. The coaxial probe is unique among techniques for measuring the dielectric properties of materials. Because the open-ended coaxial probe uses a non-invasive method that only requires contact with a material sample; the probe can characterize properties over a broad range of frequencies.

In Rivera (U.S. Pat. No. 7,495,454), a coaxial probe comprises two components. One component is a section of open coaxial line attached to a conducting flange. When placed firmly against the dielectric material of an insulator; the probe determines a relative permittivity as a function of frequency from measurements that includes a complex reflection coefficient.

The open-ended coaxial probe relies on a testing surface in which the surface is relatively flat and smooth. When the probe is placed on a surface which is not flat; errors result because of air gaps between the aperture surface and the sample. To accurately account for the presence of air gaps, computer modeling methods are required to fully represent the electromagnetic fields within the material and in the air gap region.

Examples exist for measuring the dielectric properties of a curved dielectric surface. In a prior art device, a center conductor of a probe extends to contact the material and minimize the air gap. A finite-element method is used; thereby, requiring the probe and dielectric surface to be accurately modeled. This is disadvantageous because coaxial probes are non-standard devices which could have any size; thereby, requiring a time-consuming effort for modeling varying sizes and shapes.

As such, a need exists for a probe which can contact varying surfaces such as a convex or concave dielectric surface without air gaps.

SUMMARY OF THE INVENTION

It is therefore a primary object and general purpose of the present invention to provide a probe and a calibration saddle for the probe to contact varying surfaces of a material including concave or convex dielectric surfaces in order to provide non-destructive measurement of the complex relative dielectric permittivity of the material.

To attain the present invention, a measurement probe and a calibration saddle is disclosed for the non-destructive measurement of complex relative dielectric permittivity of a dielectric material in which the material can have varying shapes.

The probe generally comprises a center electrode, two side electrodes and a mounting harness. The mounting harness serves as a central support with the side electrodes and a feed point connector attached to the harness. The center electrode is soldered to the feed point connector. Apertures in the mounting harness allow attachment of the probe to a mechanically adjustable arm in order to guide the probe onto a dielectric sample.

A bulbous tip of the center electrode is used to contact a dielectric material under test. The bulbous tip includes a surface area for improved measurement sensitivity and a smooth contour to permit rotation on the dielectric material without marring the material. The probe can rest perpendicularly on a dielectric material as well as operate in a tilted position without a loss of measurement accuracy.

The calibration saddle ensures that measurements of the reflection coefficient using the probe, are conducted near the bulbous tip. When the probe inserted into the saddle; the center electrode and the side electrodes short together with a clear indication on a vector network analyzer to which the probe is attached. By adjusting an electrical delay on the analyzer, a reference plane shifts from the end of a coaxial transmission line connected to the feed point connector to the bulbous tip.

The voltage wave generated by a vector network analyzer is guided between the electrodes, toward the bulbous tip and into the dielectric material. Gap spacing between the center electrode and the side electrodes determines the depth of the electric field infringing into the dielectric material within the saddle. The material under test reflects the incoming voltage wave back to the network analyzer with the ratio of the reflected and forward voltages forming a reflection coefficient. The dielectric properties of the material are calculated using the reflection coefficient data.

The effective permittivity detected by the probe depends on the radius of the probe tip, the radius of the insulator material and the true permittivity of the material. When the bulbous tip rests on a curved dielectric; the electric field of the probe retains the same shape with a dielectric material regardless whether the material is convex or concave.

The probe can be used in the manufacture and quality control of antenna radomes of circular and semi-circular shape. The probe can also be used to measure the moisture content of building materials such as lumber and cast concrete as well as measuring the dielectric properties of soil and rocks, biological materials or agricultural products.

BRIEF DESCRIPTION OF THE DRAWINGS

A more complete understanding of the invention and many of the attendant advantages thereto will be readily appreciated as the same becomes better understood by reference to the following detailed description when considered in conjunction with the accompanying drawings wherein like reference numerals and symbols designate identical or corresponding parts throughout the several views and wherein.

DETAILED DESCRIPTION OF THE INVENTION

The invention is a probe 10 for non-destructive measurement of complex relative dielectric permittivity $\varepsilon_m$ of an material in which the material can have varying shapes. The complex relative permittivity is determined by Equation (1) as:

$$\varepsilon_m = \varepsilon_m' - j\varepsilon_m'' \quad (1)$$

where $\varepsilon_m'$ is the dielectric constant and $\varepsilon_m''$ is the loss factor and $j=\sqrt{-1}$.

A loss tangent tan δ is defined by Equation (2) as $$\tan\delta = \frac{\varepsilon_m''}{\varepsilon_m'} \quad (2)$$

where the dielectric permittivity is determined with a complex reflection coefficient.

Figure 1:
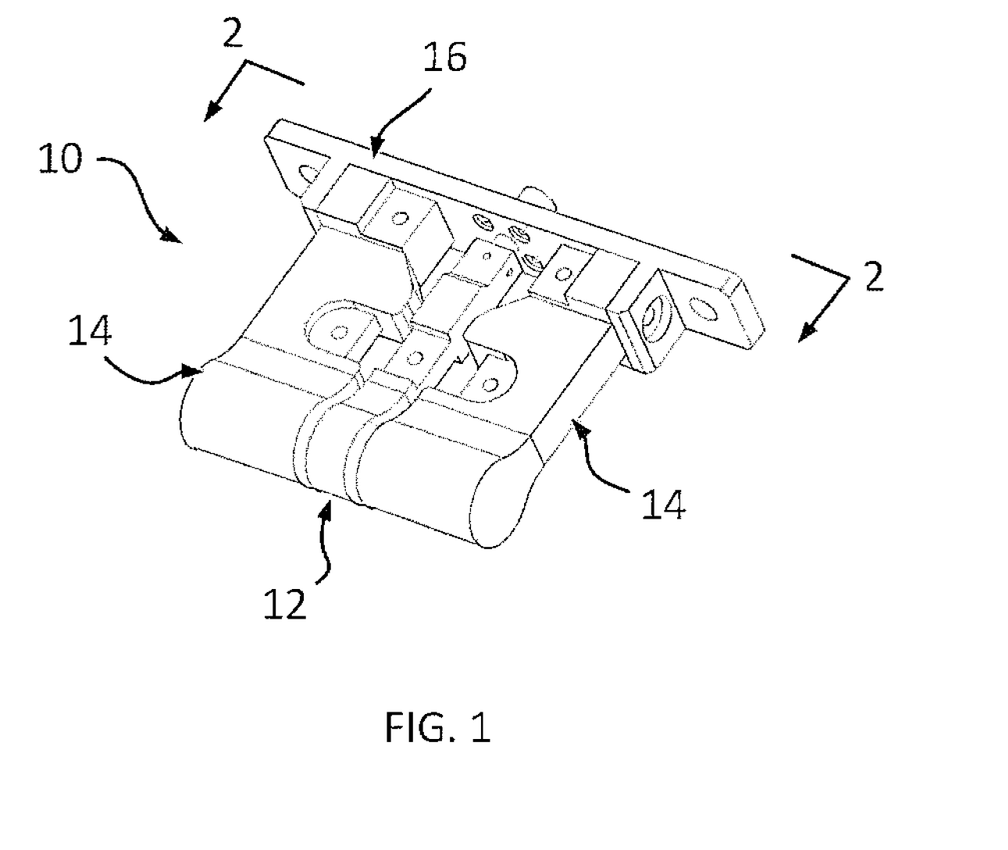
FIG. 1 depicts an isometric view of a dielectric measurement probe of the present invention.
Figure 2:
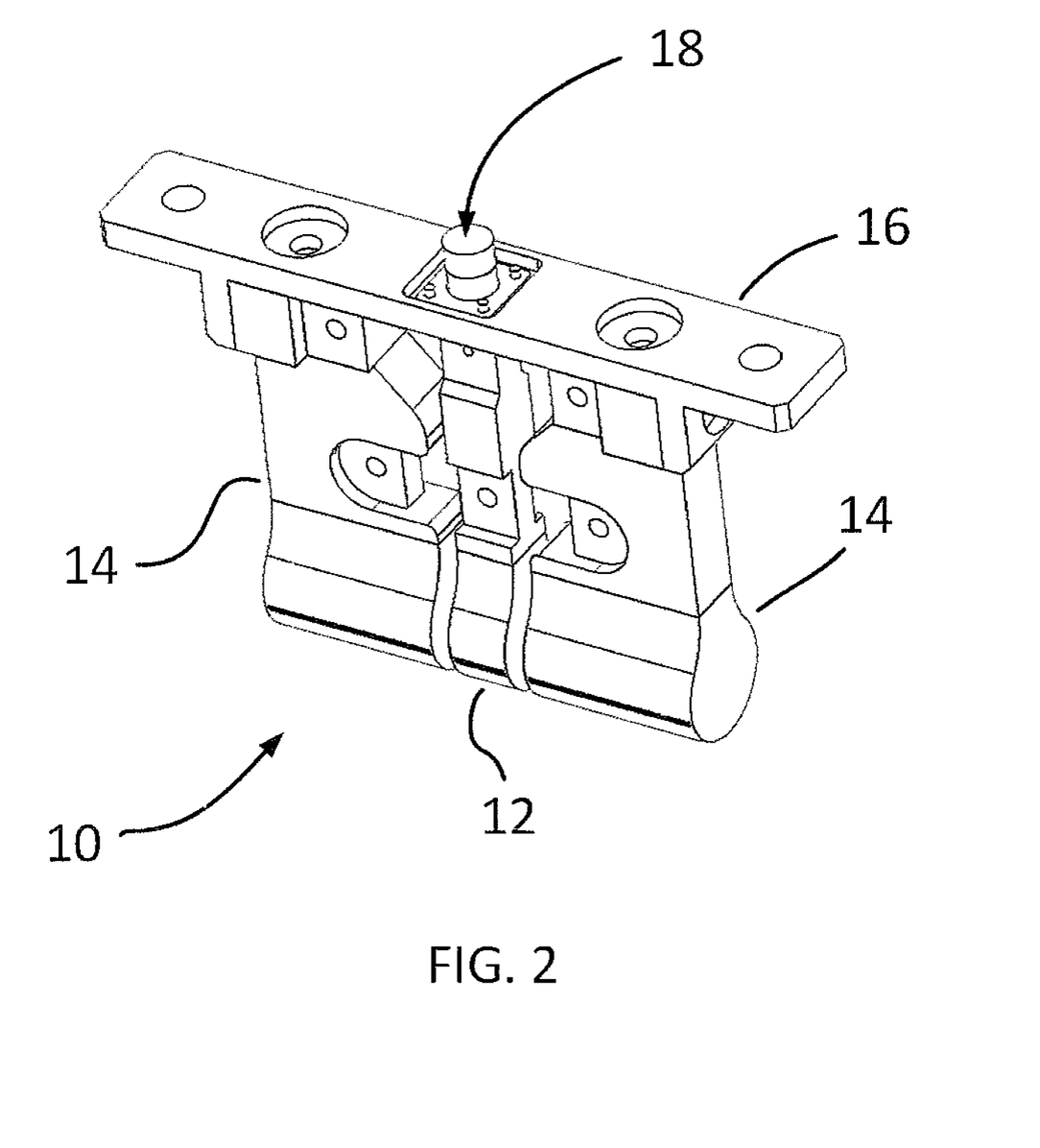
FIG. 2 depicts an alternate isometric view of the dielectric measurement probe of the present invention with the view taken along the reference lines 2-2 of FIG. 1.
Figure 3:
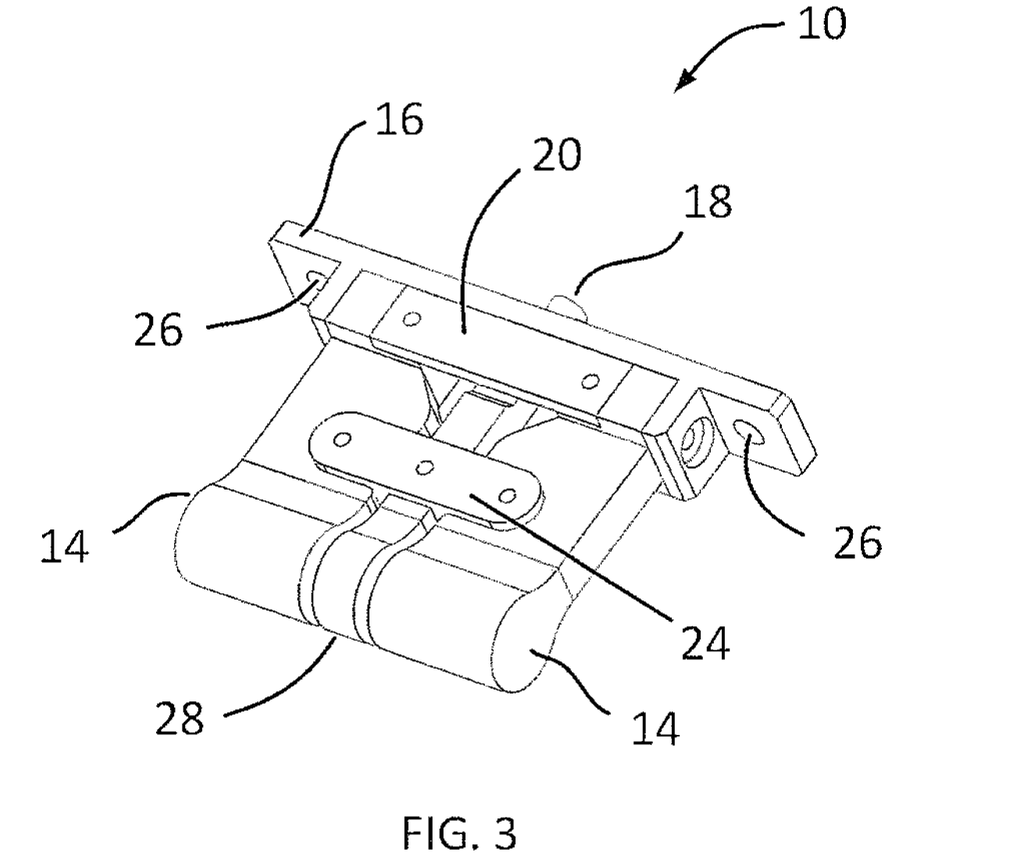
FIG. 3 depicts an isometric view of the dielectric measurement probe of the present invention with a cover plate and dielectric support positioned on the measurement probe.
Figure 4:
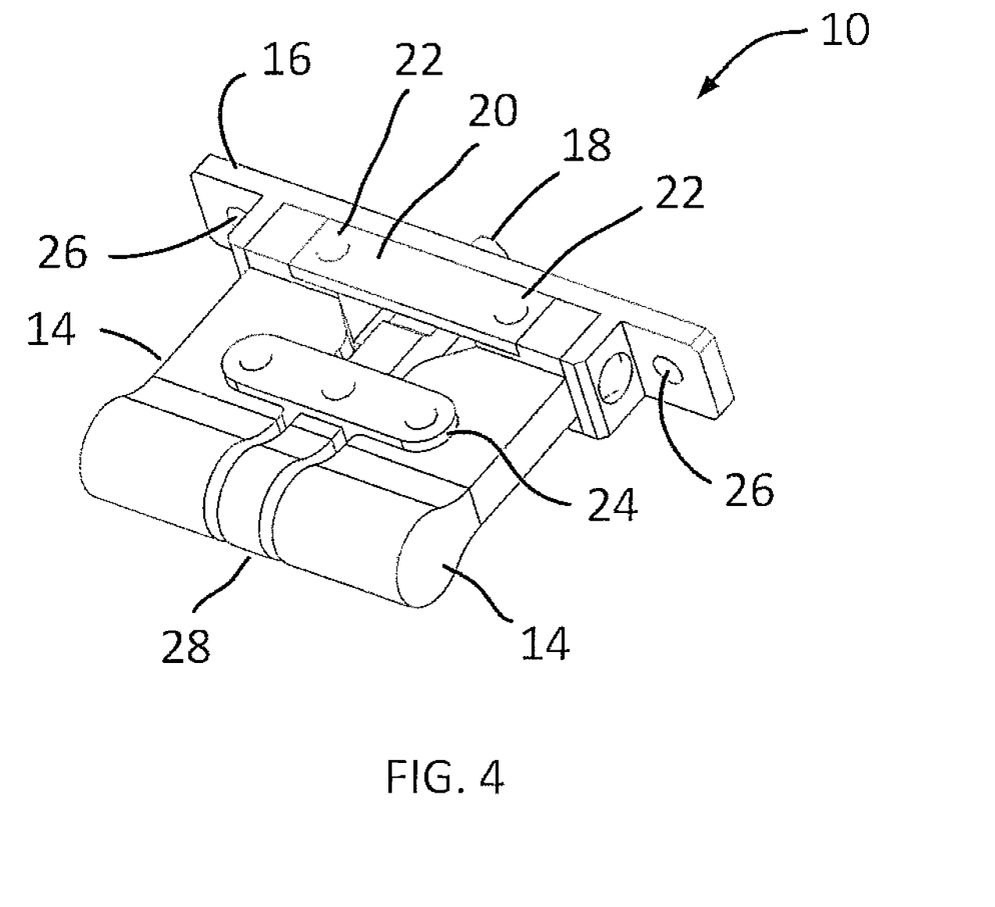
FIG. 4 depicts an isometric view of the dielectric measurement probe of the present invention with a cover plate, dielectric support, and fasteners installed on the measurement probe.

In FIG. 1 and FIG. 2, the probe 10 comprises a center electrode 12, two side electrodes 14 and a mounting harness 16. The mounting harness 16 serves as a central support because the side electrodes 14 (labeled SE1 and SE2 on the figure) and a feed point connector 18 are attached to the mounting harness. As shown in FIG. 3 and FIG. 4, the center electrode 12 is soldered to the feed point connector 18 and is protected by a cover plate 20. The cover plate 20 is attached by fasteners 22.

The side electrodes 14 and the mounting harness 16 are preferably made from stainless steel for corrosion resistance but can be made from other non-ferrous materials. A dielectric cover plate 24 is preferably made from Delrin but can be made from other high-strength polymeric composites such as flame-retardant electrical grade fiberglass.

Apertures 26 or holes in the mounting harness 16 allow attachment to a mechanically adjustable arm (not shown) to guide the probe 10 onto a dielectric sample. This feature frees an operator from having to press the probe 10 firmly against the sample for a sustained period of time; thereby, reducing fatigue and attendant errors in measurement.

A bulbous tip 28 of the center electrode 12 is used to contact a dielectric material 200 under test. The bulbous tip 28 includes a large surface area for improved measurement sensitivity and a smooth contour to permit rotation on the dielectric material without marring the finish of the material.

Figure 5:
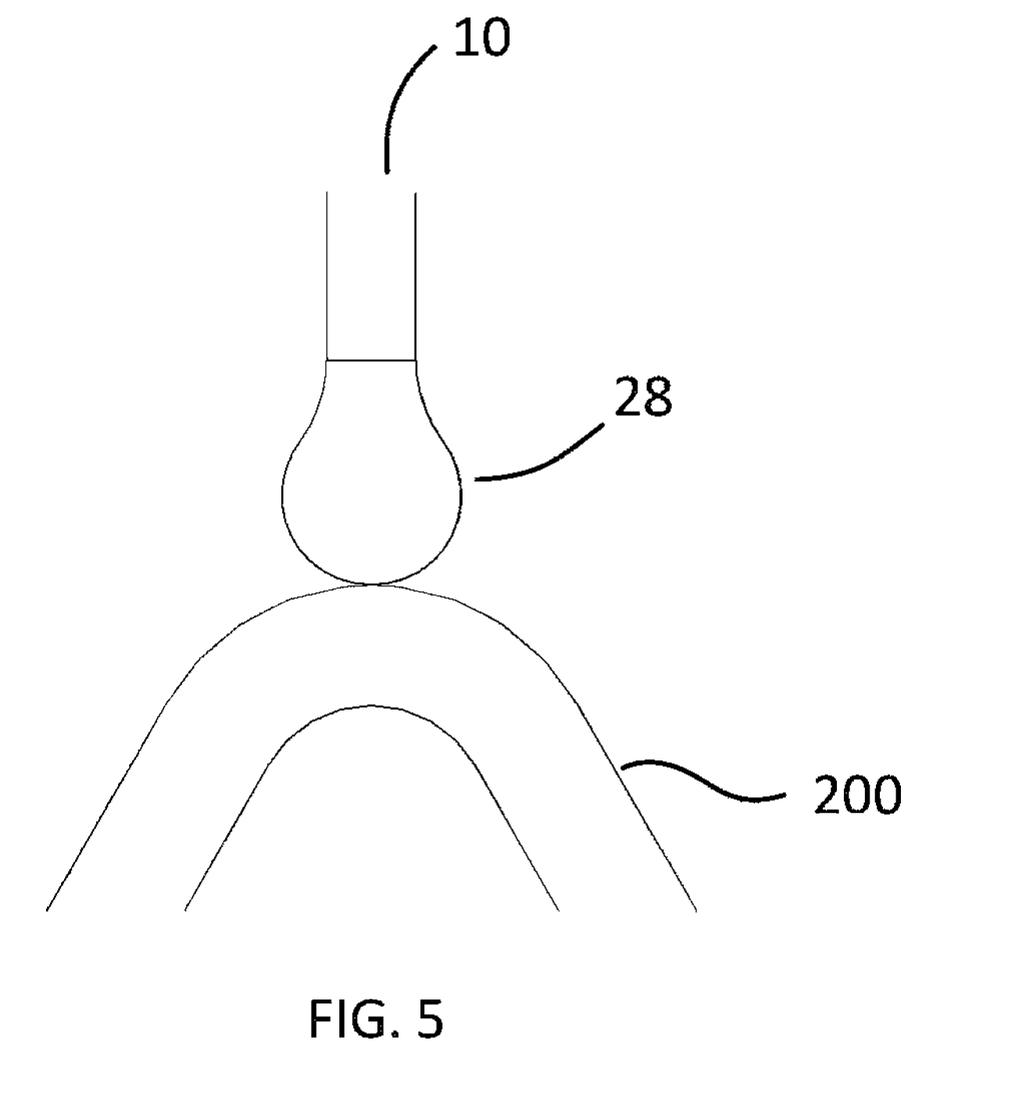
FIG. 5 depicts the probe of the present application resting on a dielectric material under test.
Figure 6:
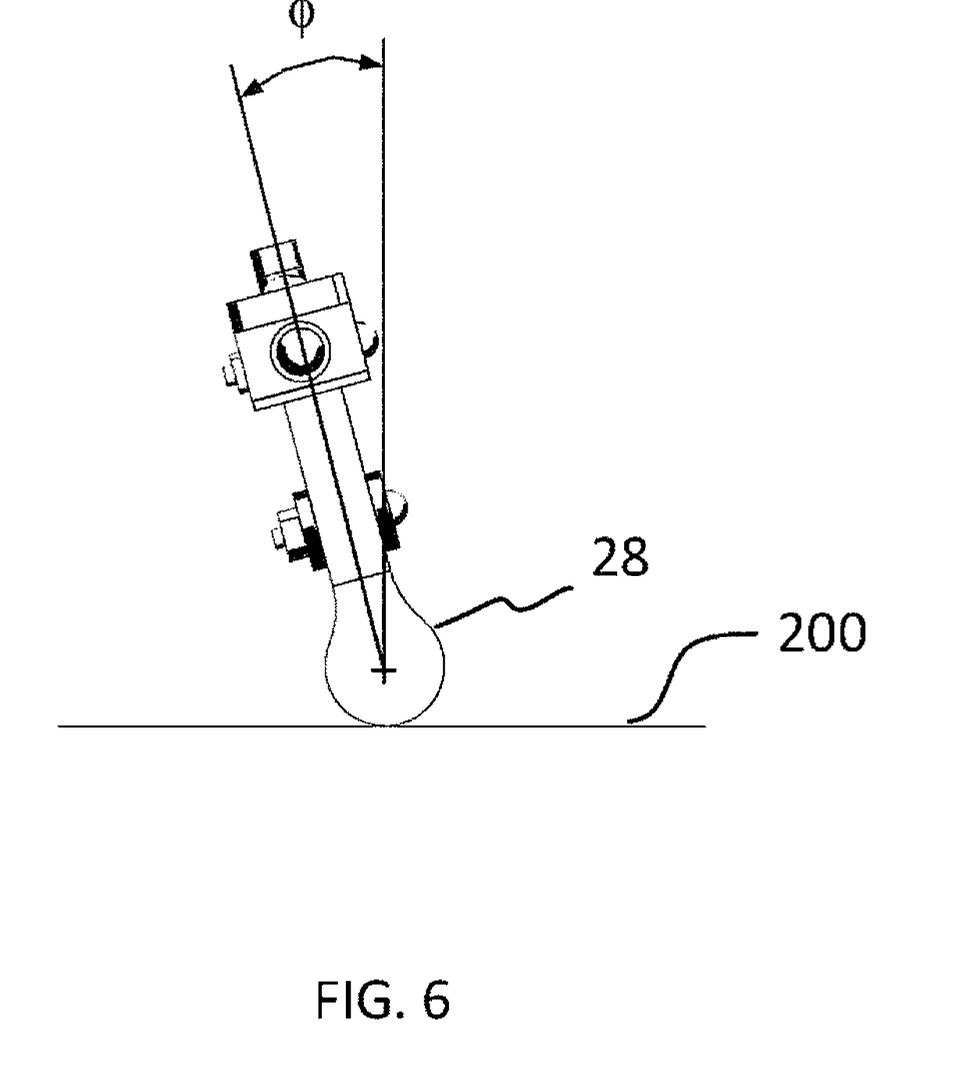
FIG. 6 depicts the probe of the present application resting at an angle on the dielectric material under test.

As shown in FIG. 5 and FIG. 6, the probe 10 can rest perpendicularly on the dielectric material 200 as well as operate in a tilted position from the perpendicular without a loss of measurement accuracy. The bulbous tip 28 can pivot on an axle between the side electrodes 14 to achieve the tilted position. The maximum deviation angle from the perpendicular is approximately ±20°. This feature permits some operator error in positioning the probe 10 on the dielectric material 200 while still obtaining accurate measurements.

Ideally, the probe 10 is positioned perpendicularly over the dielectric material 200 but there may be circumstances when the probe cannot be positioned in this manner. In these circumstances, the probe 10 can be tilted to an angle (symbol: φ) over the surface of the dielectric material 200 and can still yield reliable results.

Figure 7:
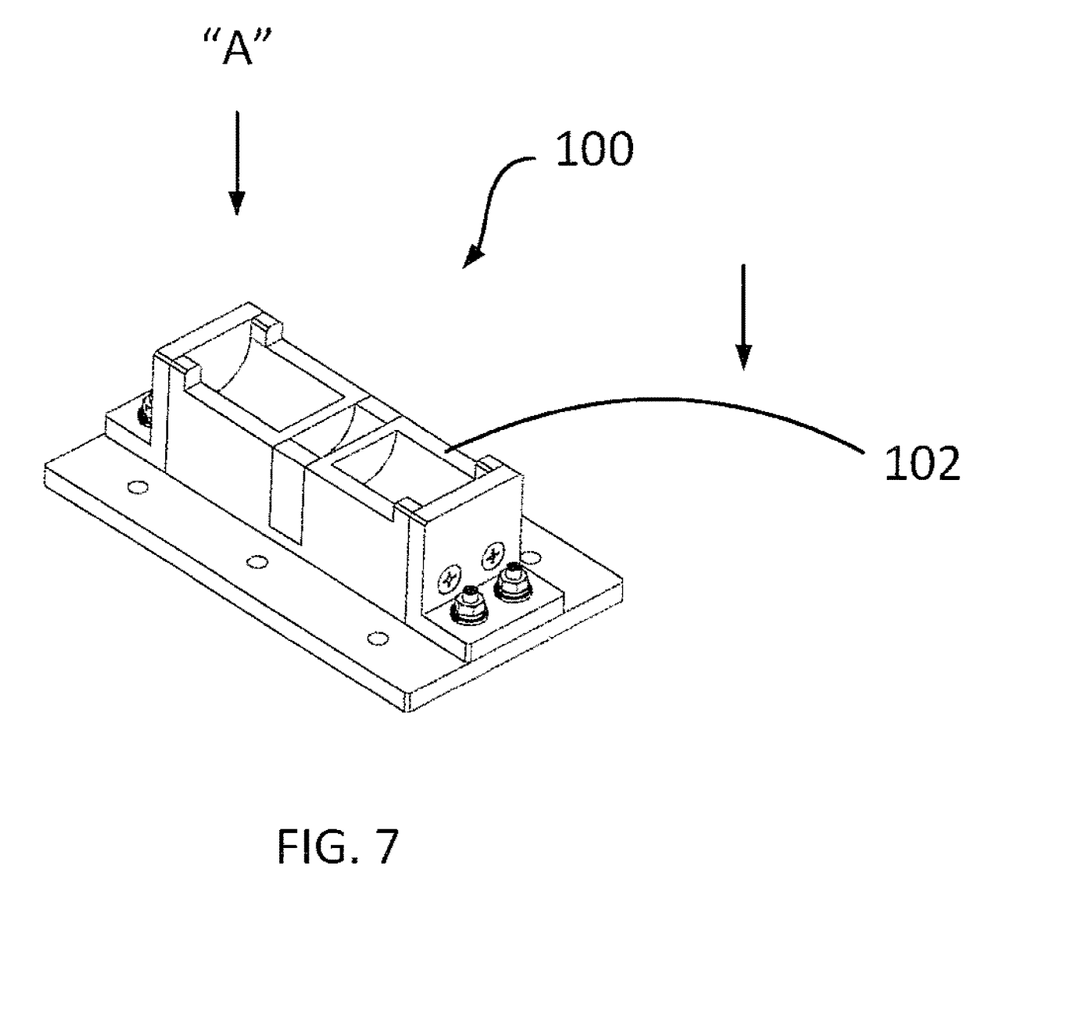
FIG. 7 depicts an isometric view of a calibration saddle for the probe of the present invention.

In FIG. 7, a calibration saddle 100 for the probe 10 is shown. The calibration saddle 100 ensures that measurements of the reflection coefficient (Γ) of the dielectric material 200 are referred to a region near the bulbous tip 28 of the probe 10. In use, the probe would be inserted in direction "A" into a recess area 102 of the calibration saddle 100. The probe 10 is then inserted in direction "A" with the result that the center electrode 12 and the side electrodes 14 short together, with a clear indication on a vector network analyzer to which the probe is attached. By adjusting an electrical delay on the vector network analyzer, a reference plane is shifted from the end of a coaxial transmission line connected to the feed point connector 18 of the probe 10 to a region of the bulbous tip 28.

As shown in the figures, the probe 10 has multiple parts. The shapes of the various parts provide a unified device that can withstand repeated handling. Important characteristics of the probe 10 are the gap spacing between the center electrode 12, the side electrodes 14 and the radius of the bulbous tip 28. The metal parts of the probe 10 can be fabricated with corrosion resistant metal such as stainless steel, naval brass or phosphor bronze.

The gap spacing between the center electrode 12 and the side electrodes 14 determines the depth of the electric field infringing into the dielectric material 200. The radius of the bulbous tip 28 increases the sensitivity of the probe 10 when measuring the permittivity of materials having air voids.

The physical size of the probe 10 is small compared to the smallest operating wavelength. This permits a simple equivalent circuit representation. The operating wavelength (λ) is defined by Equation (3)

$$\lambda = \frac{\upsilon_o}{f} \quad (3)$$

where $\upsilon_o$ is the speed of light and f is the operating frequency.

The probe 10, as illustrated in FIG. 1, is limited in operation to approximately 800 MHz where the wavelength (λ) is 15 inches. With the overall size of the probe 10 being (in inches) 5.75 wide×5.875 tall×1.5 thick; the corresponding electrical size of the probe is 0.39λ wide×0.40λ tall× 0.10λ thick. The corresponding equivalent circuit is shown in FIG. 8.

Figure 8:
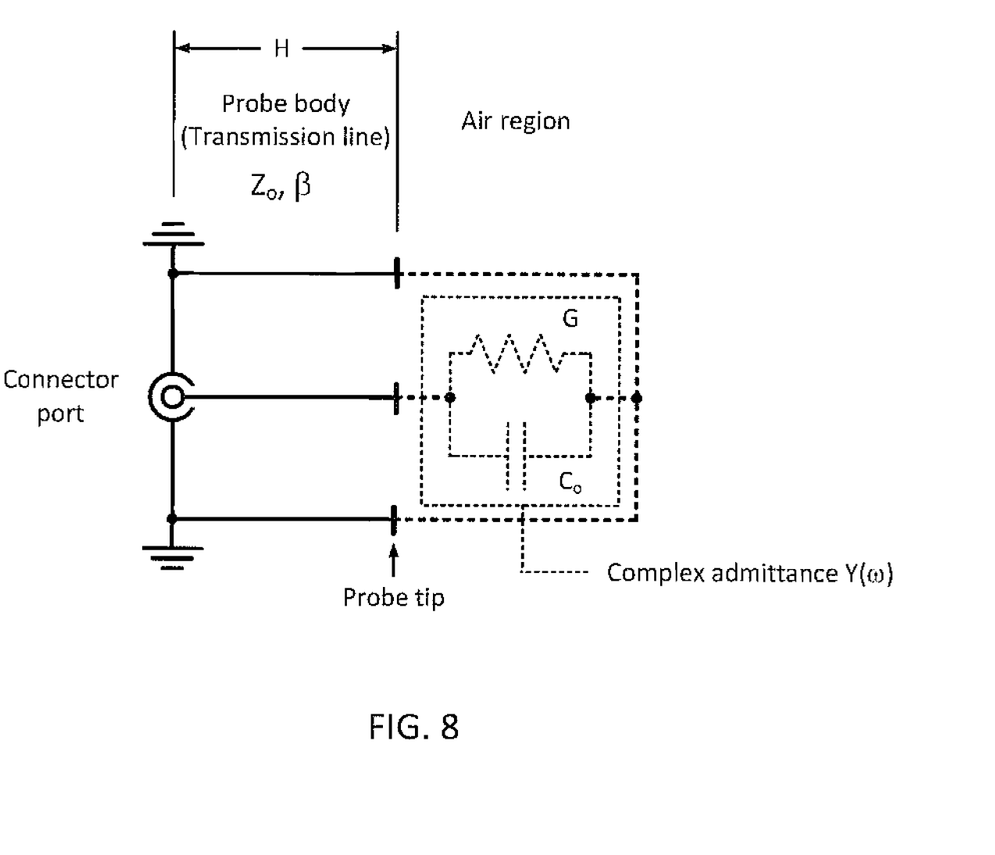
FIG. 8 depicts an electrical circuit of the probe of the present invention.

In the circuit of FIG. 8, the bulbous tip 28 is represented by a parallel-connected capacitance $C_o$ (units: Farads, F) and conductance G (units: Siemens, S) that extends outward from the probe 10, which is represented as a transmission line conduit with a characteristic (wave) impedance $Z_o$ and with a length equal to the probe height H. The parallel-connected capacitance $C_o$ and conductance G form an admittance ($Y(\omega)$, units: Siemens, S) which is calculated by Equation (4)

$$Y(\omega)=G+j\omega C_o \quad (4)$$

where w is the angular frequency (radians per second, rad/s), being proportional to the operating frequency f by Equation (5)

$$\omega=2\pi f. \quad (5)$$

The significance of the electrical quantities describing the probe 10 are that the characteristic impedance $Z_o$ is the resistance experienced by a propagating electromagnetic wave as the wave travels from the feed point connector 18 to the bulbous tip 28. The electrical quantities include: a capacitance $C_o$ representing a stored electric field energy at the bulbous tip 28; a conductance G representing energy loss from the bulbous tip in the form of radiation; and a phase constant β describing how a sinusoidal wave changes in amplitude as the wave travels between two points.

The phase constant β of the probe 10 (units: radians per meter, rad/m) is calculated by Equation (6)

$$\beta \approx 2\pi \sqrt{\varepsilon_s^*}/\lambda \quad (6)$$

where λ is previously defined and $\varepsilon_s^*$ is an effective (or apparent) value of the dielectric constant of the insulating support that holds the conducting electrodes together ($\varepsilon_s^* \approx 1.89$). The product (βH) of the phase constant β and the probe height H is the phase angle (units: radians) and describes a fraction of a full cycle of an electromagnetic wave arriving at the probe 10.

The value of $C_o$ and $Z_o$ have been measured to 0.30 picofarads (pF) and 43.7 ohms, respectively. Since the electrode spacing (s) is electrically small (the ratio $s/\lambda \ll 1$), the conductance G depends on the height of the probe (H) and the operating wavelength (λ) as expressed by Equation (7)

$$G \approx m\left(\frac{H}{\lambda}\right)^n \quad (7)$$

where the constant (m) and exponent (n) are experimentally determined.

In the operational frequency range, the height-to-wavelength ratio (H/λ) of the probe 10 is very small compared to the product $\omega C_o$ (known as the susceptance, symbol: B, units: Siemens, S) or by Equation (8)

$$G \ll \omega C_o. \quad (8)$$

The critical quantity is the capacitance $C_o$ of the bulbous tip 28 which should be as large as practicable as the capacitance depends on the surface area of the bulbous tip.

When the bulbous tip 28 contacts the dielectric material 200, the value of capacitance $C_o$ of the tip proportionally with the permittivity $\varepsilon_m$, of the material forms a modified admittance $Y^*(\omega)$ by Equation (9)

$$Y^*(\omega) \approx j\omega \varepsilon_m^e C_o \quad (9)$$

where $\varepsilon_m^e$ is an apparent value of the permittivity. This apparent permittivity is smaller than the true value ($\varepsilon_m$) because of a radius of curvature of the dielectric material 200.

A voltage wave traveling down an equivalent transmission line encounters this modified admittance and reflects a wave back whose strength is proportional to the modified admittance, from which the permittivity of the dielectric material 200 is inferred.

In the operation of the probe 10, a voltage wave generated by a vector network analyzer (not shown) is guided between the electrodes 14 and travels toward the bulbous tip 28 and into the dielectric material 200. The dielectric material 200 reflects this incoming voltage wave back to the network analyzer with an amplitude and phase that is unique to that material. The ratio of the reflected and forward voltages forms the reflection coefficient (symbol: Γ). The dielectric properties of the dielectric material 200 are inferred from reflection coefficient data.

The reflection coefficient is a complex quantity and may be written by Equation (10)

$$\Gamma=\Gamma'-j\Gamma'' \quad (10)$$

but is commonly represented by the complex exponential quantity of Equation (11)

$$\Gamma=Me^{-j\theta} \quad (11)$$

where M is the magnitude, defined in Equation (12) as $$M=\sqrt{(\Gamma')^2+(\Gamma'')^2} \quad (12)$$

and θ is the phase angle defined in Equation (13) as $$\theta = \tan^{-1}\left(\frac{\Gamma''}{\Gamma'}\right). \quad (13)$$

The probe 10 demonstrates that for low loss materials (when tan $\delta \leq 0.05$), the reflection coefficient phase angle θ changes more than the magnitude M. Lossy materials (tan $\delta > 0.05$) undergo marked changes in both M and θ.

Attendant with the voltage wave propagating between the electrodes 14; the energized probe 10 will also have an electric current flowing over the surface of the probe. The flow paths taken by the current with amplitude changes over the surface of the probe 10; generate an electromagnetic emission that is characteristic of numerous vector electric and magnetic field components.

With the probe 10 energized, small electric and magnetic field sensors (in the form of thin-wire dipoles and loop antennas), pass over the probe surface 200 at a close range to determine the vector character of emitted fields. Close range is defined as the radial distance (symbol: ρ) between the probe 10 and the field sensors, with the distance being very small compared to the operating wavelength (λ) as shown in Equation (14)

$$\rho/\lambda \ll 1. \quad (14)$$

When the probe 10 rests on a material; the emitted electric field is divided over a portion in the air space above the material and a portion in the dielectric material 200. The magnetic field emitted by the probe 10 can propagate without attenuation through the dielectric material 200.

Experiments performed with the probe 10 indicate that the depth of electric field penetration ($d_e$) into a dielectric material 200 is directly proportional to the electrode spacing (s) and is expressed in Equation (15) as $$d_e \approx 4s. \quad (15)$$

The probe 10 in FIG. 1 can penetrate into a material to a depth of approximately one inch. The depth is determined by measurements of the phase (θ) of the reflection coefficient, which is more sensitive to changes in material thickness than the reflection coefficient magnitude (M). The material thickness (t) is normalized by an electrode spacing of the probe 10.

For t/s≥4, a phase change is within 95% of the terminal phase value obtained with an infinitely thick dielectric. In practice, the dielectric material 200 does not need to be excessively thick in order to obtain an accurate determination of permittivity.

When the field penetration depth is such that the dielectric material 200 appears as if infinitely thick (that is, when $d_e \approx 4s$); the field occupies an irregularly-shaped volume $V_s$ that may be represented as geometric proportions of the probe 10, expressed in Equation (16) as $$V_s \approx (k_1 s + k_2 W_1 + k_3 W_2) as \qquad (16)$$

where $k_1$, $k_2$ and $k_3$ are frequency and material dependent constants. $W_1$ and $W_2$ are the widths of the center electrode 12 and the side electrodes 14 with a and s respectively being a radius of the bulbous tip 28 and electrode spacing. The probe 10 can detect anomalous defects in dielectrics over a region having the sensing volume $V_s$.

The determination of the true (or bulk) permittivity $\varepsilon_m$ of a curved insulator is complicated by the fact that the electric field(s) emitted by the probe 10 is (are) unequally split between the air and material regions. Also, the non-symmetrical geometric shape of the probe 10 generates a complicated electromagnetic field emission characteristic which does not permit a simple analytic implementation.

An infinite series formula is derived by the following observations: in which in the air region, the electric lines are roughly parallel to the dielectric boundary; in the immediate vicinity of the air-dielectric boundary, part of the electric field lines are parallel and parts are perpendicular; and in the dielectric, the field lines are roughly perpendicular.

As the radius of the dielectric material 200 decreases relative to the radius of the bulbous tip 28; the field intensity in the air region increases and the probe 10 detects an effective permittivity with a value between the value obtained for air ($\varepsilon_m = 1$) and the bulk permittivity of the material. As such, the effective permittivity $\varepsilon_m^e$ detected by the probe 10 depends on: the radius (symbol: a) of the bulbous tip 28; the radius (symbol: b) of the dielectric material 200; and the true ($\varepsilon_m$) permittivity of the material.

Since the dimensions of the probe 10 and the dielectric material 200 are assumed to be small compared to the smallest operating wavelength, frequency-dependent effects on the effective permittivity $\varepsilon_m^e$ are assumed to be due to innate changes in true permittivity $\varepsilon_m$ with frequency. Examples include: when $b/a \to \infty$ (a flat surface), $\varepsilon_m^e = \varepsilon_m$; when $b/a \to 0$ (a vanishing cylinder), $\varepsilon_m^e = 1$; when $\varepsilon_m = 1$ and $b/a$ is arbitrary, $\varepsilon_m^e = 1$; and the rate-of-decrease in $\varepsilon_m^e$ as $b/a \to 0$ is dependent on $\varepsilon_m$.

Observations indicate that a formula for $\varepsilon_m^e$ should have at least two terms. A first term represents the absence of a dielectric at the bulbous tip 28 (that is, $\varepsilon_m^e = 1$ when $\varepsilon_m = 1$) and a second term that accounts for the presence of a dielectric material 200 that curves away or toward the tip. The previous considerations permit deduction of the formula in the form of an infinite series, as represented in Equation (17):

$$\varepsilon_m^e = 1 + \left[ \frac{(\varepsilon_m - 1) F(\varepsilon_m, a, b)}{1 + F(\varepsilon_m, a, b)} \right] \qquad (17)$$

whereas in Equation (18):
F is a function of $\varepsilon_m, a, b$ having a mathematical form as:

$$F(\varepsilon_m, a, b) = \sum_{i=-\infty}^{\infty} \sum_{j=-\infty}^{\infty} c_{ij} (\varepsilon_m)^i \left( \frac{b}{a} \right)^j \qquad (18)$$

and $c_{ij}$ are unknown coefficients.

The infinite series formula for $\varepsilon_m^e$ describes a spatial orientation of the electric field lines emitted by the probe 10 when in contact with a curved dielectric material. It is assumed that the probe 10 can be distorted such that the electric field emitted into the dielectric sample travels in a straight line between two points, in a manner similar to a parallel-plate capacitor. The electric field lines in the parallel-plate capacitor would span a gap.

When the bulbous tip 28 rests on a curved dielectric; the electric field of the probe 10 retains the same shape (with curved lines) with a dielectric material 200 regardless whether the material is convex or concave. The infinite series formula expresses an electromagnetic field equivalence between the probe 10 resting on a curved dielectric emitting a curved electric field, and a parallel-plate capacitor with a linear electric field and two curved dielectric boundaries (air and dielectric).

The proportions of these dielectrics is dependent on the ratio of the radii of the bulbous tip 28 and dielectric sample (b/a) as well as the permittivity of the dielectric ($\varepsilon_m$). Given the asymmetric shape of the probe 10 and the electromagnetic field interaction between the probe and the dielectric material 200; the empirical infinite-series formula is a reasonable representation of the physics of the probe.

The determination of the permittivity of a material with a finite thickness requires additional observations to determine a solution. An infinitely thick material has a physical thickness (t) that is equal to (or greater than) four times the electrode spacing (s), or as in Equation (19)

$$t \geq 4s. \qquad (19)$$

Under this condition, any additional increase in the material thickness results in an incremental (and negligible) change in the phase angle (θ) of the reflection coefficient. Alternatively, thin material is one in which the inequality, as shown in Equation (20) applies $$t < 4s. \qquad (20)$$

Under this condition, the reflection coefficient (as measured at the feed point connector 18) changes with thickness because the field emitted by the probe 10 penetrates through the thin material under test and continues to a depth defined by Equation (21) where the material attains a negligibly small amplitude $$d \approx 4s. \qquad (21)$$

If the infinite-series formula is used to determine the permittivity $\varepsilon_m$; the formula would yield an erroneous answer because the probe 10 detects a smaller value of $\varepsilon_m^e$ due to an interaction between the thin material and the air space below.

Returning to the parallel-plate equivalent, two materials would appear as series-connected capacitors with unequal amounts of dielectrics. To solve this problem, the layered dielectrics are replaced with a homogeneous dielectric having an effective permittivity value ε* that is expressed in terms of the constituent dielectrics ($\varepsilon_{m1}, \varepsilon_{m2}$) and the thickness t. With the effective permittivity of the two-layer dielectric determined, this value is used to calculate the overall dielectric value seen by the probe 10. The infinite series formula is modified and written to be defined by Equation (22)

$$(\varepsilon_m^e)^* = 1 + \left[\frac{(\varepsilon^* - 1)F(\varepsilon^*, a, b)}{1 + F(\varepsilon^*, a, b)}\right] \tag{22}$$

where $$F(\varepsilon^*, a, b) = \sum_{i=-\infty}^{\infty} \sum_{j=-\infty}^{\infty} c_{ij}(\varepsilon^*)^i \left(\frac{b}{a}\right)^j. \tag{23}$$

The effective permittivity ε* of the layered dielectrics can be defined by Equation (24)

$$\varepsilon^* \approx \frac{\alpha + t^\beta}{\left[\left(\frac{t^\beta}{\varepsilon_{m1}}\right) + \left(\frac{\alpha}{\varepsilon_{m2}}\right)\right]} \tag{24}$$

where α is a shape-dependent numerical constant for the probe 10, and β is an exponent (not to be confused with phase constant).

The formula, described above, simplifies measuring a thin material under test backed by air. If $\varepsilon_{m1} = \varepsilon_m$ (the bulk relative permittivity of the material under test) and $\varepsilon_{m2} = 1$ (the dielectric material under test backed by air), the effective permittivity formula reduces to be defined by Equation (25)

$$\varepsilon^* \approx \frac{\varepsilon_m}{\left\{1 + \left[\frac{\varepsilon_m - 1}{1 + (t^\beta/\alpha)}\right]\right\}}. \tag{25}$$

Experiments with numerous convex dielectrics indicate that the exponent β is between 1.4 and 1.6, suggesting a mean value of β≈1.5. The probe constant α is a α≈0.06. For concave materials, the expression for ε* will also be the same form because of similar electric field line orientations within the thin layer, but with differing constants α and β.

A probe 10 can behave as a transmission line because electrode spacing is a small fraction of a wavelength at the highest frequency of operation. Capacitance $C_a$ is the ratio of the per-unit-length electric charge and voltage (C=Q/V) between adjacent electrodes (ground and center, respectively) in an air space above a dielectric material. A fringing capacitance $C_o$ of the bulbous tip 28 is the component that interacts with the dielectric material 200. The total capacitance $C_t(E\varepsilon)$ seen at the bulbous tip 28 is the sum in Equation (26) as $$C_t(\varepsilon) = C_a + C_o(\varepsilon - 1). \tag{26}$$

The formula above indicates that when the dielectric is air (ε=1), $C_t(1) = C_a$. Let $C_m$ be the total capacitance at the bulbous tip 28 with the material under test as defined by Equation (27)

$$C_m = C_t(\varepsilon_m) = C_{air} + (\varepsilon_m - 1)C_o. \tag{27}$$

Let $C_s$ be the total capacitance at the bulbous tip 28 with a dielectric having a permittivity $\varepsilon_s$ calculated by Equation (28)

$$C_s = C_t(\varepsilon_s) = C_{air} + (\varepsilon_s - 1)C_o. \tag{28}$$

Using the capacitances $C_m$ and $C_s$, solve for $\varepsilon_m$ by eliminating $C_o$ and obtain from Equation (29)

$$\varepsilon_m = 1 + (\varepsilon_s - 1)\left(\frac{C_m - C_{air}}{C_s - C_{air}}\right). \tag{29}$$

If each capacitance is written in terms of impedance Z, defined by Equation (30)

$$Z = \frac{1}{j\omega C} \tag{30}$$

then $$\varepsilon_m = 1 + (\varepsilon_s - 1)\left(\frac{Z_s}{Z_m}\right)\left(\frac{Z_m - Z_{air}}{Z_s - Z_{air}}\right). \tag{31}$$

The formula, previously described, indicates that the permittivity of the unknown material is determined solely by measuring the impedance of the material under test, air, and a known dielectric standard at the bulbous tip 28. A way to circumvent Equation (31) is to mathematically translate these impedances to the feed point connector or input port 18. This will involve a measurement of a short circuit.

Let $Z_{oc}^p$ be the impedance at the input port 18 with an open circuit at the bulbous tip 28. Also, let $Z_{sc}^p$ be the impedance at input port 18 with an short circuit at the bulbous tip 28. Let $Z_s^p$ be the impedance at input port 18 with a dielectric standard at the bulbous tip 28 and let $Z_m^p$ be the impedance at the input port with the dielectric material 200 at the bulbous tip.

The impedances $Z_s$, $Z_m$ and $Z_{air}$ can be rewritten in terms of the quantities above by Equation (32) and Equation (33)

$$Z_s = Z_{oc}^p \left(\frac{Z_{sc}^p - Z_s^p}{Z_s^p - Z_{oc}^p}\right) \tag{32}$$

$$Z_m = Z_{oc}^p \left(\frac{Z_{sc}^p - Z_m^p}{Z_m^p - Z_{oc}^p}\right) \tag{33}$$

and as Equation (34)

$$Z_{air} = Z_{oc}^p. \tag{34}$$

The substitution of these quantities in the $\varepsilon_m$ formula results in Equation (35)

$$\varepsilon_m^e = 1 + (\varepsilon_s - 1)\left(\frac{Z_{sc}^p - Z_s^p}{Z_{oc}^p - Z_s^p}\right)\left(\frac{Z_{oc}^p - Z_m^p}{Z_{sc}^p - Z_m^p}\right) \quad (35)$$

where the superscript p is at the input port. Since a vector network analyzer measures complex reflection coefficients ($\Gamma$); a formula for the relative permittivity of the dielectric material 200 in terms of $\Gamma$ would be more useful.

The final step in the derivation requires writing each impedance Z in terms of the respective reflection coefficients using the standard definition of Equation (36)

$$Z = Z_o\left(\frac{1+\Gamma}{1-\Gamma}\right) \quad (36)$$

where $Z_o$ is a measurement reference or system impedance (typically 50 ohms). The substitution of the formula above into the expression for $\varepsilon_m^e$ becomes $$\varepsilon_m^e = 1 + (\varepsilon_s - 1)\left(\frac{\Gamma_{sc} - \Gamma_s}{\Gamma_{oc} - \Gamma_s}\right)\left(\frac{\Gamma_{oc} - \Gamma_m}{\Gamma_{sc} - \Gamma_m}\right) \quad (37)$$

where in Equation (37), superscript p is suppressed.

Although the method for the relative permittivity $\varepsilon_m$ is derived for a flat dielectric, the method also works for curved dielectrics. If the ratio is b/a>4, the dielectric material 200 can be considered to be flat and the above formula for $\varepsilon_m^e$ can be used. If the ratio is b/a≤4, cylindrical standards (concave or convex) must be used for calibration with the same formula for the flat dielectric case, but renaming $(\varepsilon_m^e)^*$ in order to distinguish between the two cases, so in Equation (38)

$$(\varepsilon_m^e)^* = 1 + (\varepsilon_s^c - 1)\left[\frac{\Gamma_{sc}^c - \Gamma_s^c}{\Gamma_{oc}^c - \Gamma_s^c}\right]\left[\frac{\Gamma_{oc}^c - \Gamma_m^c}{\Gamma_{sc}^c - \Gamma_m^c}\right] \quad (38)$$

where $(\varepsilon_m^e)^*$ is the permittivity of the unknown curved material 200; $\varepsilon_s^c$ is the permittivity of a known curved dielectric standard; $\Gamma_{oc}$ is the complex reflection coefficient of the probe 10, measured at the feed point connector 18 with the bulbous tip 28 terminated by air (the subscript oc meaning an open circuit); $\Gamma_{sc}^c$ is the complex reflection coefficient of the probe, measured at the feed point connector, with the probe tip touching a curved metal surface (the subscript sc meaning a short circuit); $\Gamma_s^c$ is the complex reflection coefficient of the probe, measured at the feed point connector, with the bulbous tip touching the surface of a curved dielectric with a known value (the subscript s meaning a dielectric standard) and $\Gamma_m^c$ is the complex reflection coefficient of the probe, measured at the connector port, with the bulbous tip touching the surface of the curved material (the subscript m meaning the material under test or the dielectric material 200).

In the range of b/a≤4, low-loss cylindrical standards are required for calibration. Ideally, a large collection of cylindrical sizes could be available to closely match the material under test in order to accurately measure the dielectric properties.

Low-loss cylinders of varying radii (b) having a fixed permittivity $\varepsilon_s$ and a probe tip radius (a) indicate that the magnitude of the reflection coefficient M has a rate-of-change (or slope) of M with radius b written in Equation (39) as $$\frac{\Delta M}{\Delta b} = p_1(a, \varepsilon_s). \quad (39)$$

Similarly, the rate-of-change of the reflection coefficient phase angle $\theta$ with a cylindrical radius b written in Equation (40) as $$\frac{\Delta \theta}{\Delta b} = p_2(a, \varepsilon_s) \cdot f \quad (40)$$

where f is the frequency and $p_1(a,\varepsilon_s)$ and $p_2(a,\varepsilon_s)$ are constants that depend on the radius a of the bulbous tip 28 and the permittivity of the standard, $\varepsilon_s$.

For cylinders made from G-10/FR-4 fiberglass with $\varepsilon_s$=4.7−j 0.08 and a probe tip radius a=0.75 inch, these constants have the values $p_1(a,\varepsilon_s)\approx 0.002$ and $p_2(a,\varepsilon_s)\approx -0.026$ over the frequency (f) range of 50 to 400 MHz. The units of $p_1$ and $p_2$ are per inch (inch$^{-1}$) and degree per inch per MHz (deg·inch$^{-1}$·MHz$^{-1}$), respectively.

The rate-of-change of the reflection coefficient magnitude M with a metal cylinder of radius b has the form written in Equation (41) as $$\frac{\Delta M}{\Delta b} = \frac{p_3(a, \sigma)}{f} \quad (41)$$

and that the rate-of-change of the reflection coefficient phase angle $\theta$ written in Equation (42) as $$\frac{\Delta \theta}{\Delta b} = \frac{p_4(a, \sigma) \cdot f}{b} \quad (42)$$

where the constants $p_3$ and $p_4$ depend on the radius a and electrical conductivity $\sigma$ of the metal cylinder.

The values of these constants for aluminum cylinders ($\sigma$=3.5×10$^7$ Siemens per meter, S/m) are $p_3(a,\sigma)\approx -0.00003$ and $p_4(a,\sigma)\approx -0.055$. The units of the constants $p_3$ and $p_4$ are MHz per inch (MHz·inch$^{-1}$) and degrees per MHz (deg·MHz$^{-1}$), respectively, over the frequency range of 200 MHz to 600 MHz.

The results above suggest that the rate-of-change in the reflection coefficient (magnitude and phase) are sufficiently small such that diameters of the cylindrical dielectric and short circuit standards do not have to be exact in size with the material under test; some deviation is permissible. For a given radius of a material under test, the maximum deviation in the radius of the cylindrical dielectric standard and short circuit should be within ±25% to yield reliable permittivity measurement results.

Generally speaking, small-diameter materials under test are solid and larger-diameter materials under test can be either solid or hollow. This analysis is restricted to tubular materials under test that satisfies the condition written in Equation (43) as $$\frac{b}{a} > 4. \tag{43}$$

Under this condition, the material under test can be treated as flat and the permittivity formula for $\varepsilon_m^e$ can be used with a correction.

For a thin dielectric measurement, the reflection coefficients of a dielectric standard are measured, short and open and the material under test ($\Gamma_s, \Gamma_{sc}, \Gamma_{oc}, \Gamma_m$) at the frequencies of interest. Then, calculate the apparent relative permittivity seen by the probe 10. Calculate the permittivity of the material under test $\varepsilon_m$ written in Equation (44) as $$\varepsilon_m = \frac{\varepsilon^*}{1 - [\alpha(\varepsilon^* - 1)/t^\beta]} \tag{44}$$

where the probe constants ($\alpha$ and $\beta$) were previously determined. If $$\frac{t}{s} \geq 4$$

then the dielectric is considered to be infinitely thick and no correction is needed.

Figure 9:
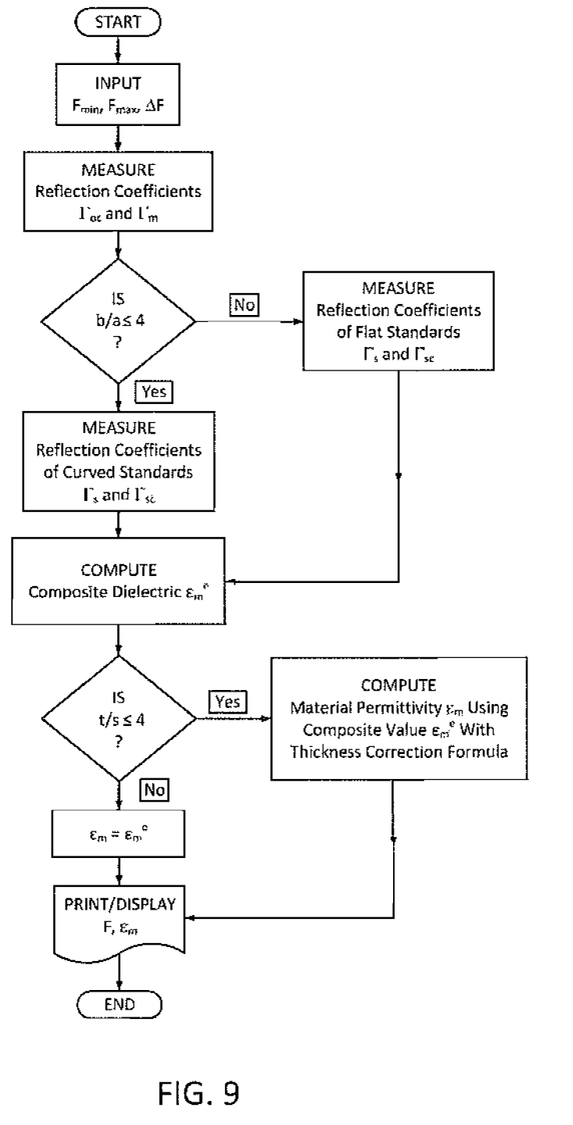
FIG. 9 depicts flow chart for the use of the probe of the present invention.

Using the preceding formulas, the method for determining the permittivity of a curved dielectric is summarized in a flowchart of FIG. 9. The flowchart can be used as a guide for programming a vector network analyzer (VNA) to collect and process reflection coefficient data.

The foregoing description of the preferred embodiments of the invention has been presented for purposes of illustration and description only. It is not intended to be exhaustive nor to limit the invention to the precise form disclosed; and obviously many modifications and variations are possible in light of the above teaching. Such modifications and variations that may be apparent to a person skilled in the art are intended to be included within the scope of this invention as defined by the accompanying claims.

What is claimed is:

1. A probe for non-destructive measurement of complex relative dielectric permittivity of a dielectric material, said probe comprising:
a mounting harness having a first rectangular section with a thickness with said mounting harness having a first face and a second face along a longitudinal axis of said first rectangular section with a first aperture thru the thickness of said first rectangular section in proximity to a first longitudinal end of said first rectangular section and a second aperture thru the thickness in proximity to a second longitudinal end of said first rectangular section, a second rectangular section having a cutout with a recess for fastener attachment and with said second rectangular section extending from the second face of said first rectangular section on a side of the first aperture opposite to the first longitudinal end, a third rectangular section having a cutout with a recess for fastener attachment to face the cutout of said second rectangular section and with said third rectangular section extending from the second face of said first rectangular section on a side of the second aperture opposite to the second longitudinal end, and a feed point connector positioned at a center of said first rectangular section to have a recess connection on the second face of said first rectangular section and a cylindrical protrusion connection on the first face of said first rectangular section;
a first side electrode formed as a rectangular section with a longitudinal first face and a longitudinal second face separated by a thickness with said section having a cutout on the longitudinal first face with a recess for fastener attachment, said first side electrode having a first end and a second end formed as a bulbous tip having a surface area wherein said first end is fastened to said second rectangular section and the second face of said first rectangular section of said mounting harness;
a second side electrode, said second electrode being a same size and shape as said first side electrode and having a cutout with a recess for fastener attachment to face the cutout of said first side electrode, said second side electrode having a first end and a second end formed as a bulbous tip having a surface area wherein said first end is fastened to said second rectangular section and the second face of said first rectangular section of said mounting harness; and
a center electrode with a thickness with said center electrode having a first end and a second end positioned between and spaced apart from said first electrode and said second electrode with said center electrode soldered at the first end to said feed point connector within the recess connection, said center electrode formed as a rectangular section with a first cutout in alignment with the cutouts of said first side electrode and said second side electrode and having a recess for fastener attachment, a second cutout in alignment with the cutouts of said second rectangular section and said third rectangular section and having a recess for fastener attachment with said center electrode having an axis of rotation between the first end and the second end to allow said center electrode to pivot, the second end formed as a bulbous tip with a surface area with a same radius as the bulbous tip of said first side electrode and a same radius as the bulbous tip of said second side electrode;
wherein a portion of the surface area of said bulbous tip of said center electrode is contactable with the material thereby permitting measurement of the dielectric permittivity of the material such that said probe is capable of accommodating a voltage wave generated by a vector network analyzer that is guided between the electrodes and travels toward the bulbous tip and into the material, the material reflects the incoming voltage wave back to thru the bulbous tip of said center electrode and said feed point connector to the network analyzer with the ratio of the reflected and forward voltages being a reflection coefficient having dielectric properties of the material inferred from data of the reflection coefficient.

2. The probe in accordance with claim 1, wherein said probe further comprises a first plate connected by fasteners to said first side electrode, said second side electrode and said center electrode at the cutouts of said first side electrode, said second side electrode and said center electrode.

3. The probe in accordance with claim 2, wherein said probe further comprises a second plate connected by fasteners to said second rectangular section, said third rectangular section and said center electrode at the cutouts of said second rectangular section, said third rectangular section and said center electrode.

4. The probe in accordance with claim 3, wherein said mounting harness said mounting harness is capable of attachment to a mechanical positioning arm thru the apertures of said rectangular section.

5. The probe in accordance with claim 3, said probe further comprising a calibration saddle with a rectangular base plate having a longitudinal first end and a longitudinal second end with a first face and a second face along a longitudinal axis of said rectangular base plate, a first bracket fastened perpendicular to the longitudinal first end with a vertical portion inside of the longitudinal first end, a second bracket fastened perpendicular to the longitudinal second end with a vertical portion inside of the longitudinal second end, a first flat section extending between a first vertical side of the vertical portion of said first bracket and an opposing first vertical side of said second bracket with said first flat section indented in proximity to the first vertical side of said first bracket and said second bracket, a second flat section extending between a second vertical side of the vertical portion of said first bracket and an opposing second vertical side of said second bracket with said second flat section indented in proximity to the second vertical side of said first bracket and said second bracket, a first half-circular section extending between the indents of said first flat section and said second section with a straight portion of said first half circular section facing away from said base plate and a second half-circular section spaced apart from said first half-circular section and extending between the indents of said first flat section and said second flat section with a straight portion of said second half-circular section facing away from said base plate wherein said rectangular base plate, said first bracket, said second bracket, said first flat plate, said second flat plate, said first half-circular section and said second half-circular section form a saddle for insertion of the probe and to cradle said first side electrode, said second side electrode and said center electrode for calibration of the probe by shorting said first side electrode, said second side electrode and said center electrode.

6. The probe in accordance with claim 5, wherein said mounting harness said mounting harness is capable of attachment to a mechanical positioning arm thru the apertures of said first rectangular section.

* * * * *